United States Patent [19]
Pao et al.

[11] Patent Number: 4,939,557
[45] Date of Patent: Jul. 3, 1990

[54] (110) GAAS MICROWAVE FET

[75] Inventors: Yi-Ching Pao, San Jose; James S. Harris, Stanford, both of Calif.

[73] Assignee: Varian Associates, Inc., Palo Alto, Calif.

[21] Appl. No.: 311,903

[22] Filed: Feb. 15, 1989

[51] Int. Cl.$^5$ .............................................. H01L 29/80
[52] U.S. Cl. ....................................... 357/22; 357/15; 357/16; 357/55; 357/60
[58] Field of Search ....................... 357/15, 16, 22, 55, 357/60

[56] References Cited

PUBLICATIONS

Allen et al.-Applied Physics Letters 51(9), p. 670, 31 Aug. 1987, "Device Quality Growth and Characterization of (110) GaAs Grown by MBE."
(1) L. Parechanian-Allen, E. R. Weber, J. Washburn and Y. C. Pao, "Surface Faceting of (110) GaAs: Analysis and Elimination", Material Research Society Symposium Proceedings, vol. 82, p. 487 (1987).
(2) L. T. P. Allen, E. R. Weber, J. Washburn, and Y. C. Pao, "Device Quality Growth and Characterization of (110) GaAs Grown by Molecular Beam Epitaxy", Applied Physics Letters 51 (9), p. 670, 31 Aug. 1987.
Y. C. Pao, Weiming Ou, and J. S. Harris, Jr., "(110)-Oriented GaAs MESFET's", IEEE Electron Device Letters, vol. 9, No, 3, p. 119, Mar. 1988.

Primary Examiner—Edward J. Wojciechowicz
Attorney, Agent, or Firm—Stanley Z. Cole; John C. Yakes

[57] ABSTRACT

A field effect transistor (FET) structure suitable for use at microwave frequencies is fabricated on a planar surface of a semi-insulating single crystal GaAs substrate which has been cut and polished to present the (110) surface. This orientation is selected because of its non-polar and other unique surface and interface properties. The (110) crystal axis is tilted from the normal of the planar surface in the direction to expose more of the (111) Ga face about 5° to facilitate molecular beam epitaxial (MBE) growth of smooth, defect-free thin films. An elongate gate electrode is formed along the bottom of an anisotropically etched trench having a pair of longitudinal sidewalls, one vertical and the other tilted outwardly. The trench is selectively oriented on the substrate to facilitate such anisotropic etching. Source and drain electrodes are respectively formed proximate the outwardly tilted and vertical trench sidewalls thereby forming a FET with a higher drain-to-gate breakdown voltage combined with lower parasitic resistance between the source and gate electrode. The invention has demonstrated potential for high speed digital circuits as well a microwave power FET applications.

31 Claims, 2 Drawing Sheets

(110) GAAS MICROWAVE FET

FIELD OF THE INVENTION

The present invention relates generally to Field Effect Transistors (FET's) and more particularly to metal semiconductor FET's (MESFET's) suitable for use at microwave frequencies. The invention is realized on a semi-insulating GaAs single crystal substrate cut and polished to present the 110 axis tilted about 5° away from the surface normal to expose more of the (111) Ga face. The invention has demonstrated potential for high-speed digital circuits as well as microwave power FET applications.

DESCRIPTION OF THE PRIOR ART

FET's fabricated on semiconducting and semi-insulating single crystal substrates are generally well known in the prior art. Single crystal ingots of GaAs are typically grown or "pulled" along the (100) axis. Wafers are most commonly cut from such ingots at right angles to the ingot's longitudinal axis. These wafers are polished to present a substantially planar surface oriented along the (100) axis. Molecular Beam Epitaxy (MBE) has traditionally been used to grow GaAs on such (100) oriented substrates to take advantage of the natural cleavage planes normal to that crystal face, the smooth morphology of the epitaxial surface obtained with a large range of growth parameters, and the excellent device behavior obtained with that orientation.

Wafers having different surface orientations can be produced by cutting slices from a (100) ingot at selected angles other than perpendicular to the longitudinal axis of the ingot. In particular, GaAs substrates aligned along the (110) axis have been of theoretical interest for some time for a variety of reasons including the non-polar surface structure presented by this orientation. In the past, it was not possible with MBE to grow (110) GaAs without highly faceted, defective surfaces which exhibited poor optical and electrical device behavior. Recently, a systematic investigation was completed which involved the analysis of facet geometry and the development of a kinetic model of initial facet formation. This investigation has led to an understanding of the proper MBE conditions to consistently grow smooth, defect-free layers of (110) GaAs suitable for device fabrication. A detailed description of this investigation and its findings may be found in L. Parechanian-Allen et al., "Surface Faceting of (110) GaAs: Analysis and Elimination", Material Research Society Symposium Proceedings Vol. 82, p. 487 (1987); and L. T. P. Allen et al., "Device Quality Growth and Characterization of (110) GaAs Grown by Molecular Beam Epitaxy", Applied Physics Letters 51 (9), p. 670, 31 August 1987, the disclosures of which are incorporated herein by reference. Of practical significance, the foregoing investigations demonstrate the importance of using a substrate of crystalline GaAs having its (110) axis tilted from the substrate surface normal about 5° in the direction which exposes more of the (111) Ga face.

SUMMARY OF THE INVENTION

The present invention extends the performance capability of FET's known in the prior art. It does so by employing a body of semi-insulating single crystal GaAs having a substantially planar surface wherein the (110) axis is tilted from the normal in the direction to expose more of the (111) Ga face in a range from 2° to 8°. A first layer of N type semiconductor material is epitaxially grown above the planar surface of the substrate and a second layer of GaAs material is grown on the first layer. An elongate gate electrode is disposed along the bottom of an anisotropically etched trench extending through portions of the second layer. The trench possesses a longitudinal center line disposed parallel the planar surface and rotationally aligned such that the trench possesses first and second longitudinal sidewalls, the first sidewall being substantially vertical and the second sidewall being tilted outwardly. A drain electrode is formed in ohmic contact on selected portions of the second layer. The drain electrode possesses an elongate edge disposed proximate and parallel the first longitudinal sidewall. A source electrode is formed in ohmic contact on other selected portions of the second layer. The source electrode possesses an elongate edge disposed proximate and parallel the second longitudinal sidewall.

Accordingly, an object of the present invention is to provide a new and improved (110)-oriented GaAs FET.

Another object of the present invention is to provide a new and improved GaAs FET with a higher drain to gate breakdown voltage and simultaneously lower parasitic resistance between the source and gate electrodes.

Another object of the present invention is to provide a new and improved GaAs FET which is inherently less vulnerable to aging caused by high temperature operation.

Still another object of the invention is to provide an off-axis (110) GaAs MESFET having equal or higher gain with equal or lower noise compared to a similarly dimensioned MESFET fabricated in (100) GaAs.

The novel features that are considered characteristic of this invention are set forth with particularity in the appended claims. cl BRIEF DESCRIPTION OF THE DRAWINGS The many objects and advantages of the present invention will become apparent to those skilled in the art when the following description of the best mode contemplated for practicing the invention is read in conjunction with the accompanying drawings, wherein like reference characters refer to the same or similar elements and in which:

DETAILED DESCRIPTION OF THE PREFERRED EMBODIMENT

Figure 1:
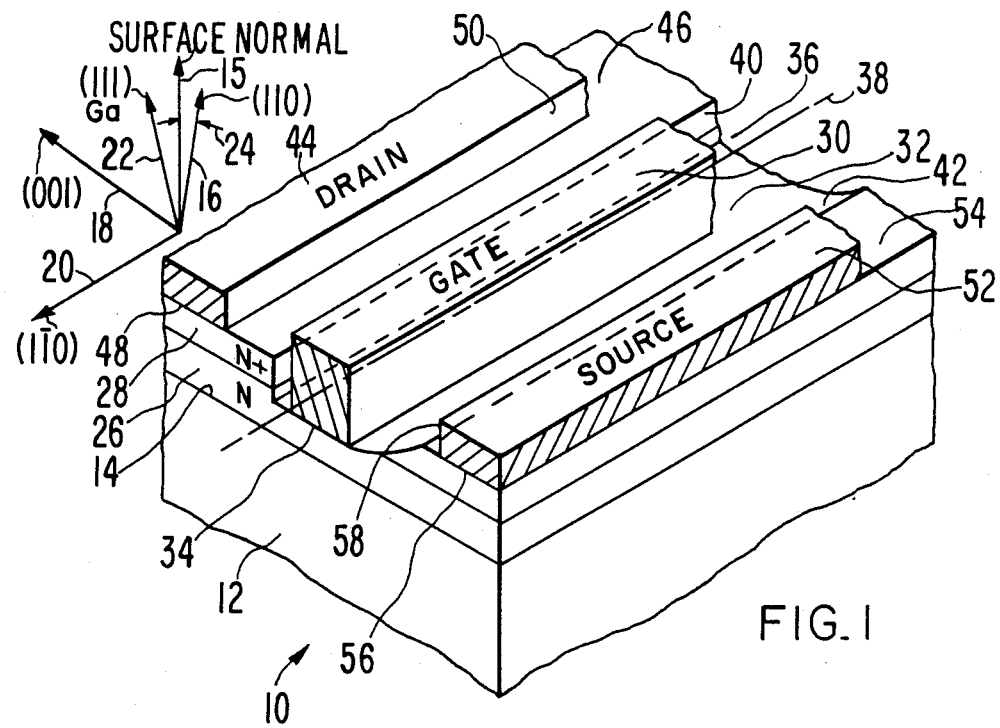
FIG. 1 is a partially broken away phantom view in perspective of a microwave FET according to the invention.

Referring now generally to the several figures and more specifically to FIG. 1, there is shown in FIG. 1 an off-axis (110) GaAs microwave FET 10. The FET 10 is fabricated on a substrate or body of semi-insulating single crystal GaAs 12 which possesses a polished, substantially planar surface 14. Such a substrate 12 may typically be in the form of a wafer. An axis 15 is shown normal to the planar surface 14. Axes 16, 18 and 20 are mutually orthogonal and form a rectilinear coordinate system. The axis 16 is normal to the (110) crystal face and the axis 18 is normal to the (001) crystal face. Accordingly, the axis 20 is normal to the ($\overline{1}$10) crystal face. An axis 22 is normal to the (111) Ga crystal face and lies in the plane defined by axes 16 and 18. In order to facilitate molecular beam epitaxial (MBE) growth on the (110) surface, the crystal lattice is tilted by rotation through an angle 24 about the axis 20 in the direction to bring the axis 22, which is normal to the (111) Ga face, nearer the surface normal 15 thereby exposing more of the (111) Ga face. The amount of lattice tilting indicated by the angle 24 is preferably in the range from 2° to 8° and more preferably about 5°. The (110) crystal surface is selected because of its non-polar and other unique surface and interface properties. Of particular interest is its anisotropic etch characteristics with selected etchants. In general, the less the (110) axis 16 is tilted from the surface normal 15, the more non-polar the substantially planar surface 14 will be.

A first layer 26 of N type semiconductor material is epitaxially grown above the substantially planar surface 14. Molecular Beam Epitaxy (MBE) is the presently preferred technology for fabricating this layer. The layer 26 is preferably doped with either Si or Te although it is to be understood that other suitable dopants may be used to form N type semiconductor material. Alternatively, if a high electron mobility transistor (HEMT) is desired, the first layer 26 may comprise AlGaAs. Again, Si and Te are among the suitable dopants which may be employed to produce N type semiconductor material. A second layer 28 preferably of GaAs material is epitaxially grown on the first layer 26. The second layer 28 is preferably doped with either Si or Te to form N+ type semiconductor material. In one embodiment, an elongate Schottky barrier gate electrode is formed on selected portions 32 of the first layer 26 thereby forming a Schottky barrier region 34 at the interface of the gate electrode 30 and selected portions 32 of the first layer 26. The Schottky barrier region 34 is disposed along the bottom of an anisotropically etched trench 36 which extends through portions of the second layer 28 and possesses a longitudinal center line 38. In order to achieve the desired trench profile, it is necessary to selectively orient the trench center line 38 with respect to the single crystal lattice. As shown in FIG. 1, center line 38 is parallel the ($\overline{1}$10) axis 20. Well known photolithographic techniques may be used to define the gate channel for anisotropic etching. For example, AZ 1370 positive photoresist may be used. After development of the gate-level resist, the exposed channel is preferably recessed using a wet chemical etch comprising ammonium hydroxide and hydrogen peroxide. The resultant anisotropically etched trench 36 possesses a first substantially vertical longitudinal sidewall 40 and a second outwardly tilted sidewall 42 as shown. This anisotropic profile is primarily attributed to the anisotropic etching behaviors of the etchant and the special nature of the (110) GaAs surface. This asymmetric trench profile is very desirable since it provides a higher breakdown voltage on the straight sidewall 40 (e.g., drain side) and lower parasitic resistance on the outwardly tilted or tailored sidewall 42 (e.g., source side).

A drain electrode 44 is formed on selected portions of the second layer 28 to form an ohmic contact region 48 at the interface therebetween. Such an ohmic contact may be formed, for example, by thermally alloying AuGe/Ni/Au. The drain electrode 44 possesses an elongate edge 50 disposed proximate and parallel the first substantially vertical longitudinal sidewall 40 of the trench 36. In like manner, a source electrode 52 is formed on other selected portions 54 of the second layer 28 thereby forming an ohmic contact region 56 at the interface. The source electrode 52 possesses an elongate edge 58 disposed proximate and parallel the second outwardly tilted sidewall 42 of the trench 36. In the embodiment shown in FIG. 1, the gate electrode 30 is preferably formed by the successive evaporation of metallization films comprising Ti, Pt, and Au to form a Schottky-barrier gate.

Figure 2:
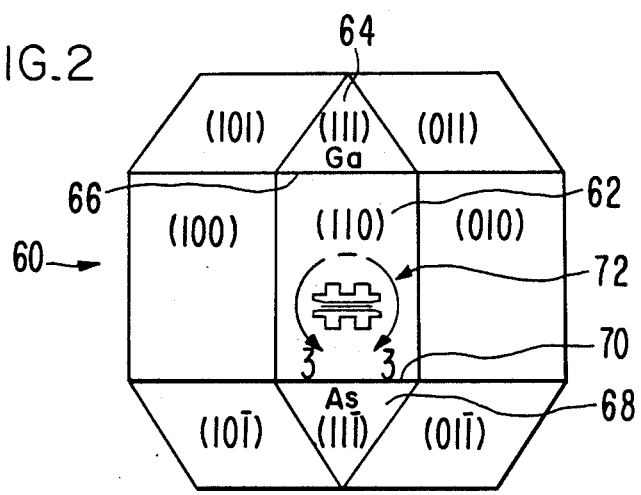
FIG. 2 is a stylized representation of portions of a single crystal of GaAs which illustrates the proper orientation of a FET according to the invention on a single crystal substrate having a substantially planar surface wherein the (110) axis is tilted from the normal in the direction to expose more of the (111) Ga face.
Figure 3:
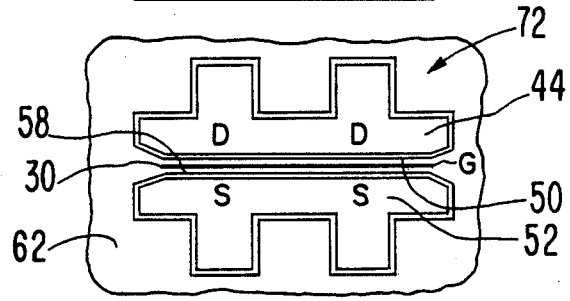
FIG. 3 is an enlargement of the FET shown in FIG. 2.

FIG. 2 is a stylized representation of portions of a single crystal of GaAs which illustrates the correct orientation of a FET according to the invention with respect to the single crystal lattice. Although the (110) crystal face 62 is shown parallel to the page, it is to be understood that in practice the crystal is tilted in the direction to expose more of the (111) Ga face 64 in a range preferably from 2° to 8°. Crystal faces 62 and 64 intersect along the line 66. Similarly, crystal faces 68 and 62 intersect along a line 70. The center line 38 of the anisotropically etched trench 36 is oriented parallel crystal face intersection lines 66 and 70. A FET 72 is shown correctly oriented on the (110) face. FIG. 3 is an enlargement of the FET 72 shown in FIG. 2 which shows that the elongate edge 50 on the drain electrode 44 is located on the side of the gate electrode 30 nearest the (111) Ga face. Conversely, the elongate edge 58 on the source electrode 52 is disposed on the other side of the gate electrode 30.

Figure 4:
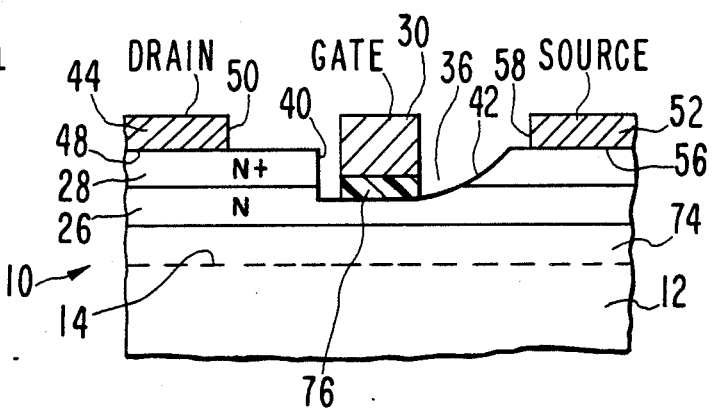
FIG. 4 is a cross sectional view of a FET in which the gate electrode is formed on a dielectric layer disposed along the bottom of the anisotropically etched trench.

In FIG. 4, there is shown yet another embodiment of the off-axis (110) GaAs microwave FET 10 of the invention. More particularly, FIG. 4 illustrates a metal insulator field effect transistor or MISFET. The body or substrate 12 is again semi-insulating single crystal GaAs. The orientation of the crystal lattice with respect to the planar surface 14 is as describes above in connection with the MESFET shown in FIG. 1. Optional buffer layers 74 of GaAs are epitaxially grown on the planar surface 14 to both smooth any surface defects and imbed any surface impurities. First and second layers 26 and 28 respectively are also similar to those described above. However, in this embodiment the gate electrode 30 is not formed directly on portions of the first layer 26 to form a Schottky barrier junction. Rather it is disposed on a third layer 76 of electrically insulating material formed on selected exposed portions of the first layer 26 along the bottom of the anisotropically etched trench 36. The third layer 76 is preferably an electrically insulating or dieletric material such as, for example, GaN, Al$_2$O$_3$, Ga-As-oxide, SiO$_2$, or Si$_3$N$_4$. The gate electrode 30 may again be formed by the successive evaporation of metalization films comprising, for example, Ti, Pt, and Au. Alternatively, as is well understood in the art, the gate electrode may be formed with highly doped polycrystalline Si. The FIG. 4 embodiment is particularly well suited for power FET applications at microwave frequencies. Unlike the FIG. 1 embodiment wherein the forward swing of input voltage is limited by the height of the Schottky barrier, the FIG. 4 embodiment employs the third layer dielectric 76 to provide enhanced gate breakdown protection.

MESFETS according to the invention have been fabricated and their performance experimentally measured. The output conductance of such MESFET's is significantly superior to similarly dimensioned prior art MESFET's fabricated on conventional GaAs substrates with a (100) surface orientation. This is important in both digital and microwave devices because the output conductance greatly influences device voltage gain and fan-out capability. Extremely low gate leakage currents have also been obtained. Although the reasons are not well understood, such low gate leakage currents may be due to either better metal-semiconductor interface qualities or fewer excess surface charges which are associated with the non-polar nature of the (110) surface orientation. The low gate leakage behavior is again very important for both digital and microwave devices where low power consumption and noise free characteristics are desirable.

Figure 5:
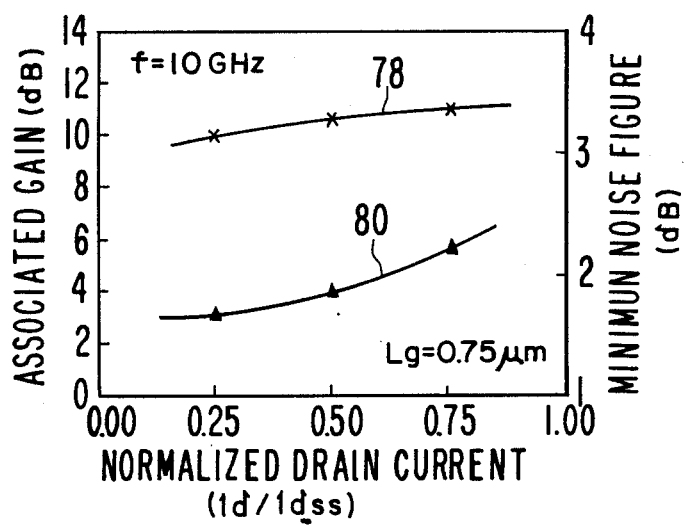
FIG. 5 is a graphical representation of minimum noise and associated gain data vs. normalized drain current measured at 10 GHz on a MESFET of the invention.
Figure 6:
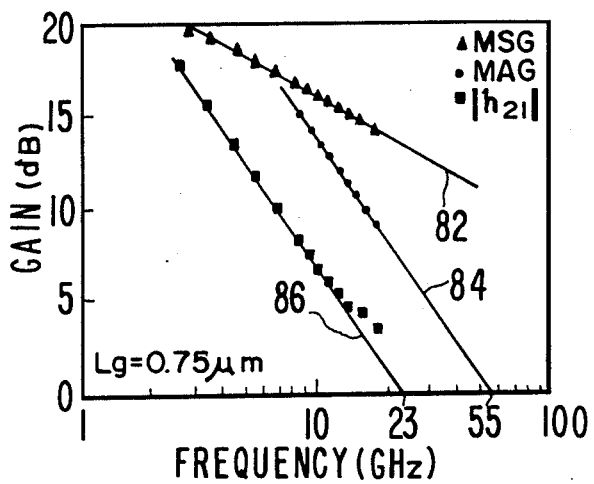
FIG. 6 is a graphical representation of experimental data showing maximum available gain, maximum stable gain, and calculated short-circuit current gain vs. frequency for an off-axis (110) MESFET of the invention.

The test data shown graphically in FIGS. 5 and 6 was measured on an off-axis (110) GaAs MESFET with a $0.75 \times 285$ $\mu$m gate biased at $V_{ds}=4$, Ids=20 mA. Referring now to FIG. 5, curvalinear line 78 shows graphically the relationship between device gain (dB) vs. normalized drain current (Id/Idss) at a frequency of 10 GHz. Simultaneously, curvalinear line 80 shows the relationship between the minimum noise figure (dB) along the right hand vertical axis and the normalized drain current (Id/Idss) shown on a lower horizontal axis. In FIG. 6, gain (dB) is plotted along the vertical axis against frequency (GHz) along the horizontal axis. Curvalinear lines 82, 84 and 86 include extrapolations beyond measured test data. Curvalinear line 86 shows the short-circuit current gain $|h_{21}|$. The maximum available gain (MAG) and the maximum stable gain (MSG) vs. frequency are shown respectively by curvalinear lines 84 and 82. The unity current gain cutoff frequency obtained by extrapolating the absolute value of $h_{21}$ with a $-6$ dB/octave slope is about 23 GHz. As the gate length (Lg) decreases, the unity current cutoff frequency will increase. Although the test data presented herein was measured on a MESFET with a gate length of 0.75 $\mu$m, electron beam lithography techniques are routinely used to fabricate FET's with 0.25 $\mu$m gate lengths. Accordingly, it is to be understood that FET's in accordance with the invention that possess useful current gain at 30 GHz, the highest frequency generally considered to be a microwave, may be fabricated. It is possible that the invention will have utility at selected millimeter wave frequencies.

A more detailed description of the fabrication and performance measurement methodology for FET's of the invention may be found in Y. C. Pao et al., "(110)-Oriented GaAs MESFET's", IEEE Electron Device Letters, Vol. 9, No. 3, p. 119, March 1988, the full disclosure of which is incorporated herein by reference.

From the foregoing detailed description, it will be evident that there are a number of changes, adaptations and modification of the present invention which come within the province of those skilled in the art. For example, although the invention has been described as a discrete device, it will have great utility when embodied as a part of a monolithic integrated circuit. Accordingly, it is intended that all such variations not departing from the spirit of the invention be considered as within the scope thereof as limited solely by the appended claims.

What is claimed is:

1. A FET suitable for use at microwave frequencies comprising:
    a body of semi-insulating single crystal GaAs having a substantially planar surface wherein the (110) axis is tilted from the normal of said substantially planar surface in the direction to expose more of the (111) Ga face in a range from 2° to 8°;
    a first layer of N type semiconductor material epitaxially grown above said substantially planar surface;
    a second layer of GaAs material epitaxially grown on said first layer;
    an elongate gate electrode disposed along the bottom of an anisotropically etched trench extending through portions of said second layer, said trench having a longitudinal center line disposed parallel said planar surface and rotationally aligned such that said trench possesses first and second longitudinal sidewalls, said first sidewall being substantially vertical and said second sidewall being tilted outwardly;
    a drain electrode formed in ohmic contact on selected portions of said second layer, said drain electrode possessing an elongate edge disposed proximate and parallel said first longitudinal sidewall; and
    a source electrode formed in ohmic contact on other selected portions of said second layer, said source electrode possessing an elongate edge disposed proximate and parallel said second longitudinal sidewall.

2. A FET suitable for use at microwave frequencies comprising:
    a body of semi-insulating single crystal GaAs having a substantially planar surface wherein the (110) axis is tilted from the normal of said substantially planar surface in the direction to expose more of the (111) Ga face in a range from 2° to 8°;
    a first layer of N type semiconductor material epitaxially grown above said substantially planar surface;
    a second layer of GaAs material epitaxially grown on said first layer;
    an elongate Schottky barrier gate electrode formed in selected portions of said first layer along the bottom of an anisotropically etched trench extending through portions of said second layer, said trench having a longitudinal center line disposed parallel said planar surface and rotationally aligned such that said trench possesses first and second longitudinal sidewalls, said first sidewall being substantially vertical and said second sidewall being tilted outwardly;
    a drain electrode formed in ohmic contact on selected portions of said second layer, said drain electrode possessing an elongate edge disposed proximate and parallel said first longitudinal sidewall; and
    a source electrode formed in ohmic contact on other selected portions of said second layer, said source electrode possessing an elongate edge disposed proximate and parallel said second longitudinal sidewall.

3. A FET as in claim 2 wherein said first layer of N type semiconductor material comprises GaAs doped with Si.

4. The FET of claim 3 wherein said second layer of GaAs is doped with Si to form N+ type semiconductor material.

5. The FET of claim 4 wherein said (110) axis is tilted from the normal of said planar surface in the direction to expose more of the (111) Ga face about 5°.

6. The FET of claim 5 wherein said Schottky barrier gate electrode comprises Ti, Pt, and Au.

7. The FET of claim 2 wherein said first layer of N type semiconductor material comprises AlGaAs doped with Si.

8. The FET of claim 7 wherein said second layer of GaAs is doped with Si to form N+ type semiconductor material.

9. The FET of claim 8 wherein said (110) axis is tilted from the normal of said planar surface in the direction to expose more of the (111) Ga face about 5°.

10. The FET of claim 9 wherein said Schottky barrier gate electrode comprises Ti, Pt, and Au.

11. The FET of claim 2 wherein said first layer of N type semiconductor material comprises GaAs doped with Te.

12. The FET of claim 2 wherein said first layer of N type semiconductor material comprises AlGaAs doped with Te.

13. A MESFET suitable for use at microwave frequencies comprising:
 a body of semi-insulating single crystal GaAs having a substantially planar surface wherein the (110) axis is tilted from the normal of said substantially planar surface in the direction to expose more of the (111) Ga face about 5°;
 a first layer of GaAs doped with Si to form N type semiconductor material epitaxially grown above said substantially planar surface;
 a second layer of GaAs doped with Si to form N+ type semiconductor material epitaxially grown on said first layer;
 an elongate Schottky barrier gate electrode formed with Ti, Pt and Au in selected portions of said first layer along the bottom of an anisotropically etched trench extending through portions of said second layer, said trench having a longitudinal center line disposed parallel said planar surface and rotationally aligned such that said trench possesses first and second longitudinal sidewalls, said first sidewall being substantially vertical and said second sidewall being tilted outwardly;
 a drain electrode formed in ohmic contact on selected portions of said second layer, said drain electrode possessing an elongate edge disposed proximate and parallel said first longitudinal sidewall; and
 a source electrode formed in ohmic contact on other selected portions of said second layer, said source electrode possessing an elongate edge disposed proximate and parallel said second longitudinal sidewall.

14. A FET suitable for use at microwave frequencies comprising:
 a body of semi-insulating single crystal GaAs having a substantially planar surface wherein the (110) axis is tilted from the normal of said substantially planar surface in the direction to expose more of the (111) Ga face in a range from 2° to 8°;
 a first layer of N type semiconductor material epitaxially grown above said substantially planar surface;
 a second layer of GaAs material epitaxially grown on said first layer;
 an anisotropically etched trench extending through portions of said second layer, said trench having a longitudinal center line disposed parallel said planar surface and rotationally aligned such that said trench possesses first and second longitudinal sidewalls, said first sidewall being substantially vertical and said second sidewall being tilted outwardly;
 a third layer of electrically insulating material formed on selected exposed portions of said first layer of material along the bottom of said anisotropically etched trench;
 an elongate gate electrode formed on selected portions of said third layer along the bottom of said anisotropically etched trench;
 a drain electrode formed in ohmic contact on selected portions of said second layer, said drain electrode possessing an elongate edge disposed proximate and parallel said first longitudinal sidewall; and
 a source electrode formed in ohmic contact on other selected portions of said second layer, said source electrode possessing an elongate edge disposed proximate and parallel said second longitudinal sidewall.

15. A FET as in claim 14 wherein said first layer of N type semiconductor material comprises GaAs doped with Si.

16. The FET of claim 15 wherein said second layer of GaAs is doped with Si to form N+ type semiconductor material.

17. The FET of claim 16 wherein said (110) axis is tilted from the normal of said planar surface in the direction to expose more of the (111) Ga face about 5°.

18. The FET of claim 16 wherein said third layer of electrically insulating material comprises $SiO_2$.

19. The FET of claim 16 wherein said third layer of electrically insulating material comprises $Si_3N_4$.

20. The FET of claim 19 wherein said elongate gate electrode comprises highly doped polycrystalline Si.

21. The FET of claim 19 wherein said elongate gate electrode comprises a metal.

22. The FET of claim 14 wherein said first layer of N type semiconductor material comprises AlGaAs doped with Si.

23. The FET of claim 22 wherein said second layer of GaAs is doped with Si to form N+ type semiconductor material.

24. The FET of claim 23 wherein said (110) axis is tilted from the normal of said planar surface in the direction to expose more of the (111) Ga face about 5°.

25. The FET of claim 23 wherein said third layer of electrically insulating material comprises $SiO_2$.

26. The FET of claim 23 wherein said third layer of electrically insulating material comprises $Si_3N_4$.

27. The FET of claim 26 wherein said elongate gate electrode comprises highly doped polycrystalline Si.

28. The FET of claim 26 wherein said elongate gate electrode comprises a metal.

29. The FET of claim 14 wherein said first layer of N type semiconductor material comprises GaAs doped with Te.

30. The FET of claim 14 wherein said first layer of N type semiconductor material comprises AlGaAs dopes with Te.

31. A MISFET suitable for use at microwave frequencies comprising:
 a body of semi-insulating single crystal GaAs having a substantially planar surface wherein the (110) axis is tilted from the normal of said substantially planar surface in the direction to expose more of the (111) Ga face about 5°;

a first layer of GaAs doped with Si to form N type semiconductor material epitaxially grown above said substantially planar surface;

a second layer of GaAs doped with Si to form N+ type semiconductor material epitaxially grown on said first layer;

an anisotropically etched trench extending through portions of said second layer, said trench having a longitudinal center line disposed parallel said planar surface and rotationally aligned such that said trench possesses first and second longitudinal sidewalls, said first sidewall being substantially vertical and said second sidewall being tilted outwardly;

a third layer of electrically insulating material formed on selected exposed portions of said first layer of material along the bottom of said anisotropically etched trench;

an elongate gate electrode formed on selected portions of said third layer along the bottom of said anisotropically etched trench;

a drain electrode formed in ohmic contact on selected portions of said second layer, said drain electrode possessing an elongate edge disposed proximate and parallel said first longitudinal sidewall; and a source electrode formed in ohmic contact on other selected portions of said second layer, said source electrode possessing an elongate edge disposed proximate and parallel said second longitudinal sidewall.

* * * * *